United States Patent
Shani et al.

(10) Patent No.: US 11,125,926 B2
(45) Date of Patent: *Sep. 21, 2021

(54) PLANAR REMOTE PHOSPHOR ILLUMINATION APPARATUS

(71) Applicants: Yosi Shani, Maccabim (IL); Tania Kosoburd, Lod (IL); Pierre Avner Badehi, Nataf (IL); Dafna Bortman-Arbiv, Zichron Yaacov (IL); Gadi Segal, Ramat Gan (IL); Inna Mishustin, Beit Shemesh (IL); Yigal Malyanker, Beit Arieh (IL)

(72) Inventors: Yosi Shani, Maccabim (IL); Tania Kosoburd, Lod (IL); Pierre Avner Badehi, Nataf (IL); Dafna Bortman-Arbiv, Zichron Yaacov (IL); Gadi Segal, Ramat Gan (IL); Inna Mishustin, Beit Shemesh (IL); Yigal Malyanker, Beit Arieh (IL)

(73) Assignee: OREE ADVANCED ILLUMINATION SOLUTIONS LTD., Rosh Haain (IL)

( * ) Notice: Subject to any disclaimer, the term of this patent is extended or adjusted under 35 U.S.C. 154(b) by 0 days.

This patent is subject to a terminal disclaimer.

(21) Appl. No.: 16/508,386

(22) Filed: Jul. 11, 2019

(65) Prior Publication Data
US 2020/0003945 A1    Jan. 2, 2020

Related U.S. Application Data

(63) Continuation of application No. 15/825,370, filed on Nov. 29, 2017, now Pat. No. 10,379,279, which is a
(Continued)

(51) Int. Cl.
*F21V 8/00* (2006.01)
*F21V 9/30* (2018.01)
(Continued)

(52) U.S. Cl.
CPC ............ *G02B 6/0031* (2013.01); *F21V 9/30* (2018.02); *F21V 9/32* (2018.02); *G02B 6/0015* (2013.01);
(Continued)

(58) Field of Classification Search
CPC . G02B 6/0026; F21K 9/61; F21K 9/62; F21K 9/64; G02F 2001/133614;
(Continued)

(56) References Cited

U.S. PATENT DOCUMENTS 7,168,842 B2   1/2007   Chou et al.
8,408,775 B1   4/2013   Coleman
(Continued)

FOREIGN PATENT DOCUMENTS

EP   1882974 A1   1/2008

OTHER PUBLICATIONS

International Search Report and Written Opinion dated Oct. 28, 2013 for International Application No. PCT/IB2013/001651 (12 pages).

*Primary Examiner* — Sean P Gramling
(74) *Attorney, Agent, or Firm* — Morgan, Lewis & Bockius LLP

(57) ABSTRACT

In various embodiments, an illumination apparatus features spatially separated input and output regions, a light source, a phosphor for light conversion, and an out-coupling structure.

21 Claims, 15 Drawing Sheets

Related U.S. Application Data continuation of application No. 14/409,195, filed as application No. PCT/IB2013/001651 on Jun. 28, 2013, now Pat. No. 9,857,519.

(60) Provisional application No. 61/667,432, filed on Jul. 3, 2012, provisional application No. 61/684,762, filed on Aug. 19, 2012.

(51) Int. Cl.
*F21V 9/32* (2018.01)
*G02F 1/1335* (2006.01)

(52) U.S. Cl.
CPC ......... *G02B 6/0023* (2013.01); *G02B 6/0026* (2013.01); *G02F 1/133614* (2021.01); *G02B 6/0021* (2013.01); *G02B 6/0085* (2013.01); *G02B 6/0096* (2013.01); *H01L 2224/48091* (2013.01)

(58) Field of Classification Search
CPC ........ G02F 1/133614; F21V 1/17; F21V 3/08; F21V 3/12; F21V 5/10; F21V 7/26; F21V 7/30; F21V 9/30; F21V 9/32; F21V 13/08; F21V 13/14
See application file for complete search history.

(56) References Cited

U.S. PATENT DOCUMENTS

| | | |
|---|---|---|
| 9,857,519 B2 | 1/2018 | Shani et al. |
| 2004/0129945 A1 | 7/2004 | Uemura |
| 2006/0001037 A1 | 1/2006 | Schardt et al. |
| 2006/0072339 A1 | 4/2006 | Li et al. |
| 2006/0291238 A1 | 12/2006 | Epstein et al. |
| 2007/0086184 A1* | 4/2007 | Pugh .................... G02B 6/0023 362/231 |
| 2007/0274094 A1* | 11/2007 | Schultz .................... F21V 7/22 362/601 |
| 2007/0274100 A1 | 11/2007 | Yang et al. |
| 2008/0025045 A1 | 1/2008 | Mii |
| 2009/0046978 A1 | 2/2009 | Yasuda et al. |
| 2009/0141476 A1* | 6/2009 | Meir ...................... G02B 6/005 362/84 |
| 2009/0257215 A1 | 10/2009 | Gomi |
| 2009/0262517 A1 | 10/2009 | Suehiro et al. |
| 2010/0002414 A1 | 1/2010 | Meir et al. |
| 2010/0103650 A1 | 4/2010 | Herrmann et al. |
| 2010/0220484 A1 | 9/2010 | Shani et al. |
| 2011/0037926 A1* | 2/2011 | Tsukahara ............. G02B 6/005 349/64 |
| 2011/0170316 A1 | 7/2011 | Overes |
| 2013/0010492 A1 | 1/2013 | Montgomery et al. |
| 2013/0021822 A1 | 1/2013 | Wimmer |
| 2018/0088269 A1 | 3/2018 | Shani et al. |

* cited by examiner

PLANAR REMOTE PHOSPHOR ILLUMINATION APPARATUS

CROSS-REFERENCE TO RELATED APPLICATIONS

This application is a continuation of U.S. patent application Ser. No. 15/825,370, filed Nov. 29, 2017, which is a continuation of U.S. patent application Ser. No. 14/409,195, filed Dec. 18, 2014, which is the U.S. national stage application of International (PCT) Patent Application Serial No. PCT/IB2013/001651, filed Jun. 28, 2013, which claims priority to and the benefit of U.S. Provisional Patent Application No. 61/667,432, filed on Jul. 3, 2012, and U.S. Provisional Patent Application No. 61/684,762, filed on Aug. 19, 2012, the entire disclosure of each of which is incorporated by reference herein.

FIELD OF THE INVENTION

In various embodiments, the present invention relates to artificial illumination, and in particular to an illumination apparatus incorporating a remote phosphor.

BACKGROUND

Light-emitting diodes (LEDs) are gradually replacing incandescent light bulbs in various applications, including traffic signal lamps, large-sized full-color outdoor displays, various lamps for automobiles, solid-state lighting devices, flat panel displays, and the like. Conventional LEDs typically include a light-emitting semiconductor material, also known as the bare die, and numerous additional components designed for improving the performance of the LED. These components may include a light-reflecting cup mounted below the bare die, a transparent encapsulation (typically silicone) surrounding and protecting the bare die and the light reflecting cup, and electrical leads for supplying the electrical current to the bare die. The bare die and the additional components are efficiently packed in an LED package.

The advent of blue- and ultraviolet-emitting LEDs has enabled the widespread deployment of LED-based white light sources for, e.g., general lighting applications and backlights for liquid crystal displays. In many such light sources, a portion the high-frequency light of the LED is converted to light of a different frequency, and the converted light combines with unconverted light to form white light. Yellow-emitting phosphors have been advantageously combined with blue LEDs in this manner. One popular configuration for LEDs and phosphors is the "remote-phosphor" arrangement, in which the phosphor and the LED are spatially separated to (1) maintain the phosphor at a lower temperature during LED operation and thereby improves efficiency of the phosphor and (2) reduce the amount of light that is backscattered from the phosphor and absorbed by the LED itself (which lowers the overall efficiency of the device).

Planar remote-phosphor LED-based devices have additional advantages. In such devices, the phosphor is typically located at a greater distance from the LEDs and is thus exposed to much lower temperatures during operation, and light reflected from the phosphor may not propagate back to the light-absorbing LED. In addition, planar devices are very attractive due to their slim appearance; in contrast to LEDs, which are point sources of light, a planar device emits light from a larger area.

FIG. 1 schematically depicts a conventional planar remote-phosphor LED lighting device 100, in which the LED 110 is spatially separated from a phosphor layer 120 on a waveguide 130. In some configurations, scattering elements (e.g., located at the bottom surface of waveguide 130) disrupt the total-internal-reflection (TIR) confinement of light within waveguide 130 so that the light may be emitted through the phosphor layer 120. (As used herein, TIR confinement refers to confinement of light due to the index-of-refraction difference between the confining waveguide and the surrounding ambient, e.g., air, rather than via an opaque reflector.) While the distance between the LED 110 and the phosphor layer 120 improves illumination efficiency, as described above, this configuration does have disadvantages. First, as shown in FIG. 1, the phosphor layer is often applied to the exit surface of the waveguide (as that is typically the farthest point from the LED), but the exit surface is often quite large. Thus, a large amount of phosphor material, which is typically exotic and/or expensive, is required. For example, the planar lighting device 100 has a large exit surface that requires a significant amount of phosphor in the coating phosphor layer 120. This results in low utilization of the phosphor (in terms of light intensity emitted per amount of phosphor in the coating), which may be expensive. Second, since the particular LED/phosphor combination in the lighting device constrains the choice of suitable phosphor materials, the lighting device may require use of a phosphor material that has an undesirable color when the lighting device is in the off state (i.e., not emitting light). For example, many conventional phosphors have yellow and/or green hues that dictate the color of (at least a large portion of) the lighting device itself in the off state. In many applications it may be desirable for the lighting device to have a different (or even controllable) appearance in the off state. Thus, there is a need for remote-phosphor lighting devices that utilize less phosphor material without significantly impacting performance and the off-state color of which may be controlled and/or unconstrained by the color of the phosphor material itself. Furthermore, such devices preferably have a slim geometry and also minimize the amount of light reflected back from the remote phosphor into the LED itself, which tends to absorb such light and reduce overall efficiency.

SUMMARY

In accordance with various embodiments of the present invention, LED-based illumination devices incorporate remotely situated phosphors in configurations utilizing less phosphor material that traditional devices and that enable control over the off-state appearance of the device. In general, preferred embodiments of the invention have configurations in which a remote phosphor (i.e., a phosphor spatially separated from the LED light source, which may be one or more bare-die LEDs, and/or any lenses or packages included therein) is located within a waveguide but not within the output region or at the output surface thereof. Rather, the phosphor is located within the input region of the waveguide, which is spatially separated from the output region and receives light from one or more LEDs, or the phosphor is located within a discrete conversion region disposed between (and spatially separate from) the input and output regions. Embodiments of the invention featuring a conversion region typically include an aperture (i.e., one or more small openings formed within the waveguide or by the geometry of the waveguide itself) that separates the input region from the conversion region and that permits propagation of light into the conversion region but that substantially prevents light within the conversion region from reflecting back into the input region (and reaching the LED, which may be light absorbing).

Light from the LED (e.g., blue or ultraviolet light) is converted by the phosphor to light of a different wavelength (i.e., is wavelength-converted), and the converted light mixes with additional unconverted light to form mixed light that may be, for example, white light or light of another desired color. The unconverted light may originate from the LED and/or from one or more other LEDs emitting at wavelengths at which wavelength conversion does not occur, e.g. red light. Such mixing occurs within the input and/or conversion regions, and thus the mixed light typically is substantially uniform in intensity and/or color prior to propagating into the output region and being emitted therefrom. Because the phosphor material is not disposed within the output region or at the emitting surface of the waveguide, the phosphor does not impact the appearance of the illumination device when it is not illuminated.

In an aspect, embodiments of the invention feature an illumination apparatus including or consisting essentially of a substantially planar waveguide, a light source, a layer of phosphor material for converting a portion of light emitted from the light source to a different wavelength, a reflector, and an out-coupling structure. The waveguide has (i) top and bottom opposed surfaces, (ii) an input region for receiving light, and (iii) spatially separated from the input region, an output region for emitting light, the output region including or consisting essentially of at least a portion of the top surface of the waveguide. At least a portion of the waveguide confines light by total internal reflection from an interface between a surface of the waveguide and the surrounding ambient. The light source emits light into the input region. The layer of phosphor material is disposed on a surface of the waveguide in the input region. The reflector is disposed on the layer of phosphor material in the input region. The reflected converted light and reflected unconverted light combine with unconverted light from the light source to form, within the input region, mixed light that is substantially uniform in at least one of intensity or color. The out-coupling structure is disposed in the output region and disrupts total internal reflection of substantially uniform mixed light received from the input region such that the substantially uniform mixed light is emitted from the output region.

Embodiments of the invention may feature one or more of the following in any of a variety of combinations. The mixed light may increase in uniformity within the input region along a direction toward the output region and may be substantially uniform entering the output region. The out-coupling structure may include or consist essentially of a plurality of discrete optical elements (e.g., prisms, hemispheres, scattering particles, and/or diffusive dots). The out-coupling structure may be disposed, in the output region, proximate the top surface of the waveguide, proximate the bottom surface of the waveguide, and/or within the waveguide. The light source may be partially or fully embedded within the waveguide material. The light source may include or consist essentially of a light-emitting diode, e.g., a bare-die light-emitting diode (i.e., the semiconductor light-emitting die absent packaging elements such as a heat sink or lenses) or a packaged light-emitting diode. The light-emitting diode may be disposed on a substrate, and a second reflector may be disposed over the substrate. A surface of the waveguide in the input region may have a curvature for reflecting light toward the output region. An optical cavity may be disposed within the input region of the waveguide. The optical cavity may include or consist essentially of a material having an index of refraction different from an index of refraction of the waveguide. At least a portion of a boundary of the optical cavity may be reflective. The optical cavity may include or consist essentially of a hollow space within the waveguide. The waveguide may include or consist essentially of at least two discrete parts attached together. Some of, or even each of, the parts may define a portion of the optical cavity.

A heat sink may be thermally connected to (i.e., positioned to conduct heat away from, even if not in direct physical contact with) the phosphor material. A surface of the waveguide may inwardly protrude in the input region to form a protrusion. Reflection of light from the protrusion may promote light mixing in the input region. The layer of phosphor material may be in optical contact (i.e., not merely in physical contact and with no air gap in between) with the waveguide. The waveguide may have a side surface spanning the top and bottom surfaces. A second reflector may be disposed over at least a portion of the top, bottom, and/or side surface of the waveguide. The apparatus may include a second input region (i) for receiving light, (ii) disposed within the waveguide, and (iii) spatially separated from the input and output regions. A second light source, different from the light source, may emit light into the second input region. A second layer of phosphor material for converting a portion of light emitted from the second light source to a different wavelength may be disposed on a surface of the waveguide in the second input region. A second reflector for reflecting converted light back into the second input region may be disposed on the second layer of phosphor material in the second input region. The reflected converted light may combine with unconverted light from the second light source to form, within the second input region, mixed light that is substantially uniform in at least one of intensity or color. The apparatus may include a second output region (i) for emitting light, (ii) disposed within the waveguide, and (iii) spatially separated from the input and output regions. The input region may be disposed between the output region and the second output region. A second out-coupling structure for disrupting total internal reflection of substantially uniform mixed light received from the input region such that the substantially uniform mixed light is emitted from the second output region may be disposed in the second output region.

In another aspect, embodiments of the invention feature an illumination apparatus including or consisting essentially of a substantially planar waveguide, a light source, an aperture, a phosphor material, and an out-coupling structure. The waveguide has (i) top and bottom opposed surfaces, (ii) an input region for receiving light, (iii) spatially separated from the input region, an output region for emitting light, the output region including or consisting essentially of at least a portion of the top surface of the waveguide, (iv) spatially separated from and disposed between the input and output regions, a conversion region for receiving light from the input region, mixing the received light with light generated in the conversion region, and propagating the mixed light to the output region. At least a portion of the waveguide confines light by total internal reflection from an interface between a surface of the waveguide and the surrounding ambient. The light source emits light into the input region. The aperture separates the input region from the conversion region and permits propagation of light from the input region while substantially preventing reflection of light within the conversion region back into the input region. The phosphor material is disposed in the conversion region and converts a portion of light received from the input region to a different wavelength. The converted light mixes with unconverted light within the conversion region to form, within the conversion region, mixed light that is substantially uniform in at least one of intensity or color. The out-coupling structure is disposed in the output region and disrupts total internal reflection of substantially uniform mixed light received from the conversion region such that the substantially uniform mixed light is emitted from the output region.

Embodiments of the invention may feature one or more of the following in any of a variety of combinations. The mixed light may increase in uniformity within the conversion region along a direction toward the output region and may be substantially uniform entering the output region. The out-coupling structure may include or consist essentially of a plurality of discrete optical elements (e.g., prisms, hemispheres, scattering particles, and/or diffusive dots). The out-coupling structure may be disposed, in the output region, proximate the top surface of the waveguide, proximate the bottom surface of the waveguide, and/or within the waveguide. The light source may be partially or fully embedded within the waveguide material. The light source may include or consist essentially of a light-emitting diode, e.g., a bare-die light-emitting diode or a packaged light-emitting diode. The light source may include an optic for focusing light toward the aperture. The phosphor material may be disposed within the waveguide or on an inner or outer surface of the waveguide. A reflector for reflecting light into the waveguide may be disposed on the phosphor material. The phosphor material may be in optical contact with the waveguide. A heat sink may be thermally connected to the phosphor material. A surface of the waveguide in the input region may have a curvature for reflecting light toward the aperture.

An optical cavity may be disposed within the waveguide. At least a portion of the aperture may be disposed between the optical cavity and a surface of the waveguide. The optical cavity may include or consist essentially of a material having an index of refraction different from an index of refraction of the waveguide. At least a portion of a boundary of the optical cavity may be reflective. The optical cavity may include or consist essentially of a hollow space within the waveguide. The waveguide may include or consist essentially of at least two discrete parts attached together. Some of, or even each of, the parts may define a portion of the optical cavity. The aperture may be at least partially defined by an inward protrusion of a surface of the waveguide. The waveguide may have a side surface spanning the top and bottom surfaces. A reflector may be disposed over at least a portion of the top, bottom, and/or side surface of the waveguide. The apparatus may include a second input region (i) for receiving light, (ii) disposed within the waveguide, and (iii) spatially separated from the input, conversion, and output regions. A second light source, different from the light source, may emit light into the second input region. A second conversion region, spatially separated from the input, conversion, output, and second input regions, may receive light from the second input region, mix the received light with light generated in the second conversion region, and propagate the mixed light to the output region. A second aperture may separate the second input region from the second conversion region, and the second aperture may substantially prevent propagation of light from the second input region while substantially preventing reflection of light within the second conversion region back into the second input region. A second phosphor material for converting a portion of light received from the second input region to a different wavelength may be disposed in the second conversion region. The converted light may mix with unconverted light within the second conversion region to form, within the second conversion region, mixed light that is substantially uniform in at least one of intensity or color. The apparatus may include a second output region (i) for emitting light, (ii) disposed within the waveguide, and (iii) spatially separated from the input, conversion, and output regions. The input region may be disposed between the output region and the second output region. A second conversion region for receiving light from the input region, mixing the received light with light generated in the second conversion region, and propagating the mixed light to the second output region may be disposed between and spatially separated from the input and second output regions. A second out-coupling structure may be disposed in the second output region and may disrupt total internal reflection of substantially uniform mixed light received from the input region such that the substantially uniform mixed light is emitted from the second output region.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the term "approximately" means±10%, and in some embodiments, ±5%, unless otherwise indicated. As used herein, the term "substantially" means at least 50%; in some embodiments, "substantially" means at least 60%, at least 80%, or even at least 90%. The term "consists essentially of" means excluding other materials or structures that contribute to function, unless otherwise defined herein. The term "photoluminescent material" is commonly used herein to describe one or a plurality of photoluminescent materials (which exhibit, for example, chemoluminescence, fluorescence, and/or phosphorescence), e.g., in layered or mixed form, and is utilized interchangeably with "phosphor" and "phosphor material." Additionally, a photoluminescent material may comprise one or more types of photoluminescent molecules. In any event, a photoluminescent material is characterized by an absorption spectrum (i.e., a range of wavelengths of light which may be absorbed by the photoluminescent molecules to effect quantum transition to a higher energy level) and an emission spectrum (i.e., a range of wavelengths of light which are emitted by the photoluminescent molecules as a result of quantum transition to a lower energy level). The emission spectrum of the photoluminescent layer is typically wider and shifted relative to its absorption spectrum.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1:
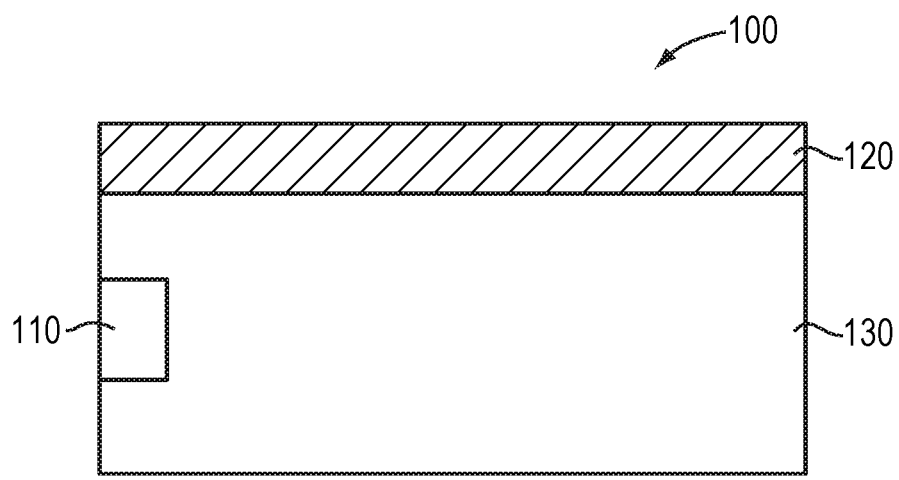
FIG. 1 is a cross-sectional schematic of a conventional remote-phosphor LED-based illumination device.
Figure 2A:
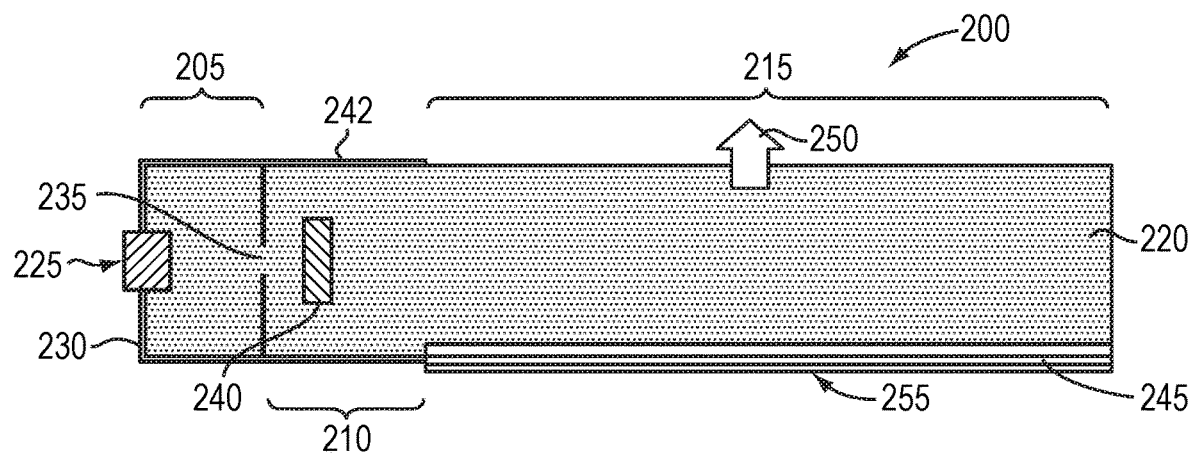
FIGS. 2A-2C are cross-sectional schematics of illumination devices in accordance with various embodiments of the invention.
Figure 2B:
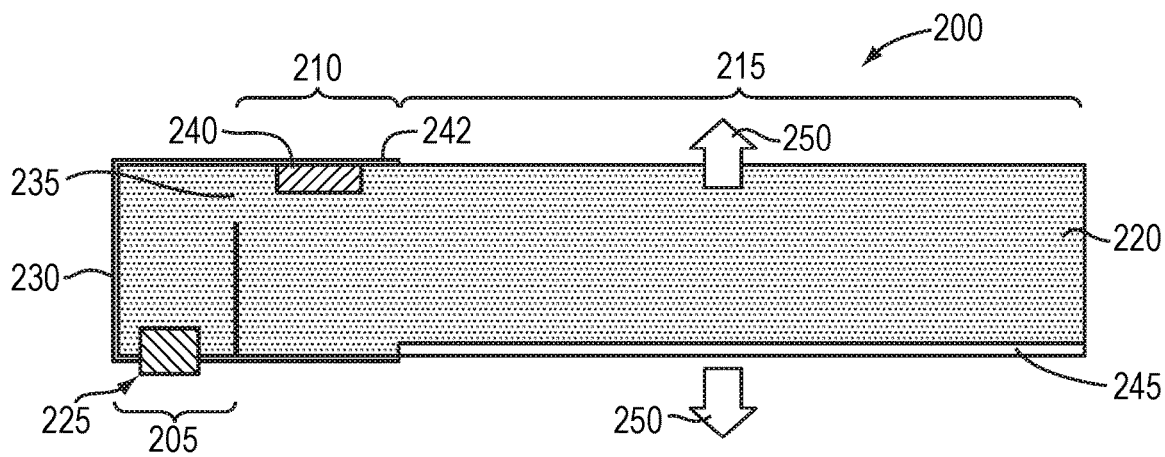
Figure 2C:
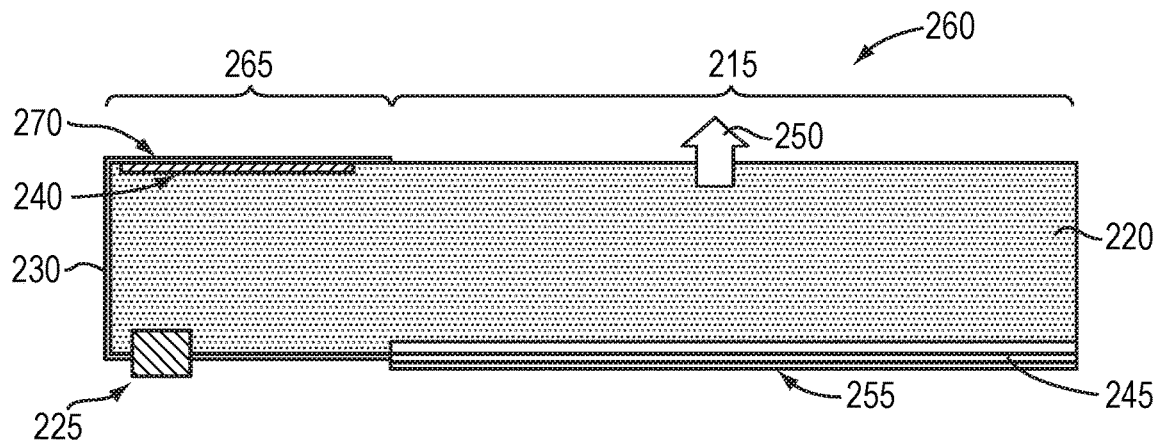

FIGS. 2A-2C schematically depict aspects of illumination devices in accordance with various embodiments of the present invention. FIG. 2A illustrates an illumination device 200 that features an input region 205, a conversion region 210, and an output region 215 within a waveguide 220. As shown, the input region 205, conversion region 210, and output region 215 are spatially separate and discrete from each other. Light from an LED 225 (which may include or consist essentially of one or more bare-die LEDs and/or packaged LEDs; references herein to a singular LED may refer to multiple LEDs unless otherwise indicated) is in-coupled into waveguide 220 within input region 205. The LED 225 may be at least partially (or even fully) embedded within (i.e., surrounded by) the input region 205, and the LED 225 may be located at a side facet (or "face" or "surface," which are herein utilized interchangeably with "facet") of waveguide 220 (as shown in FIG. 2A) and/or at the bottom facet of waveguide 220 (as shown in FIG. 2B), and/or at a different location within the input region 205. The light from LED 225 is confined within the input region 205 via TIR and/or reflection from one or more reflectors 230, which may be reflectors or reflective coatings on the waveguide surfaces, and propagates to the conversion region 210 through an aperture 235. As shown, the aperture 235 may be defined by a physical structure (e.g., a reflector or other structure formed from a material different from the waveguide material) disposed within the waveguide 220, or the aperture 235 may be defined by the geometry of the waveguide 220 itself (as discussed below). The waveguide 220 may include or consist essentially of, for example, one or more polymeric materials, e.g., silicone, latex, polyvinyl-chloride, nitrile, chloroprene (Neoprene), poly(cis-isoprene), poly(2,3-dimethylbutadiene), poly(dimethylsiloxane), ethylene/vinyl acetate copolymer-40% vinyl acetate, ethylene/vinyl acetate copolymer-30% vinyl acetate, poly(butadiene-co-acrylonitrile), natural rubber, poly(chloroprene), polymethylmethacrylate, and/or polycarbonate.

Within the conversion region 210, a phosphor 240 wavelength-converts some of the light from LED 225, and the converted light mixes with additional unconverted light to form, e.g., white light. The phosphor 240 may be disposed within the conversion region 210 (as shown in FIG. 2A) or on an inner and/or outer surface of the waveguide 220 in the conversion region 210 (as shown in FIG. 2B). Light within the conversion region 210 is confined via TIR and/or reflection from one or more reflectors 242 and propagates to the output region 215. Although some light in the conversion region 210 may be back-reflected through the aperture 235 into the input region 205, most light (or even substantially all of the light) in the conversion region 210 will propagate to the output region 215 due to the small size of the aperture 235. Furthermore, in preferred embodiments, the light within the conversion region 210 mixes to form mixed light that is substantially uniform in intensity and/or color, such that the light that enters the output region 215 and is emitted from device 200 is substantially uniform in intensity and/or color over substantially the entire surface(s) of emission.

After the mixed light enters the output region 215, any TIR confinement thereof is broken by an out-coupling structure 245, which thus causes the light to be out-coupled from one (as shown in FIG. 2A) or more (as shown in FIG. 2B) surfaces of the waveguide 220 (as indicated by arrows 250). The out-coupling structure 245 may include or consist essentially of, e.g., a feature such as a wedge and/or a plurality of optical elements (e.g., prisms, hemispheres, scattering particles, diffusive dots, etc.). As shown in FIGS. 2A-2C, the out-coupling structure 245 may be located at a surface of the waveguide 220 (e.g., the bottom surface), or the out-coupling structure 245 may be located at multiple surfaces of the waveguide 220, within the waveguide 220 itself, or a combination of any of these locations. Thus, the output region 215 is the region from which light is coupled out of the waveguide 220, and the area of output region 215 is, in various embodiments, approximately the area occupied by the out-coupling structure 245. In some embodiments, the area of the output region 215 may be smaller than the area occupied by the out-coupling structure 245 if, e.g., the user is not interested in out-coupling all of the available light. In other embodiments, the area of the output region 215 may be larger than the area occupied by the out-coupling structure 245 if, e.g., the user is less concerned with the uniformity at the periphery of the output region 215.

Due at least in part to the mixing occurring within the conversion region 210, the out-coupled light 250 is preferably substantially laterally uniform (i.e., uniform in a direction substantially perpendicular to a longitudinal propagation direction extending from the input region to the output region) in color and/or intensity over the entirety of the emission surface(s) of the output region 215. As recognized by those of skill in the art, longitudinal uniformity may be achieved via proper design of the out-coupling structure 245. As shown in FIG. 2A, a reflector 255 may coat, may be placed in close proximity to, or may otherwise be disposed on one or more surfaces of the waveguide 220 in the output region 215 in order to prevent light emission from such surfaces.

As mentioned above, the aperture 235 typically allows only a small amount of light to propagate from the conversion region 210 into the input region 205. This is primarily due to the nature of light emission from the LED 225 and the phosphor 240. Typically light is emitted from an LED die substantially omnidirectionally; however, the LED 225 is typically small relative to the dimensions of the waveguide 220 and the aperture 235, and thus light emitted therefrom may be focused toward the aperture 235 (or toward a reflector or reflective surface to be reflected toward the aperture 235 thereby) by, e.g., an optic (e.g., a lens) that may be part of a packaged LED 225 or that may be part of the input-region geometry. Even without such an optic, most light within the input region 205 may eventually travel through the aperture 235 even if it first reflects from one or more surfaces within the input region 205. Within the conversion region 210, the light strikes the phosphor 240, which emits converted light in multiple directions (e.g., diffusively) and may even scatter unconverted light in multiple directions. Thus, substantially all of the light within the conversion region 210 will propagate away from the aperture 235 and will instead propagate toward the output region 215.

FIG. 2C illustrates an illumination device 260 in accordance with various other embodiments of the present invention. In illumination device 260, the input region 205 and conversion region 210 of illumination device 200 of FIGS. 2A and 2B are combined into a single input region 265 that contains the phosphor 240 and into which light from the LED 225 is in-coupled. In preferred embodiments, the phosphor 240 is disposed near or on an inner or outer surface of the waveguide in the input region 265, and a reflector 270 (e.g., a reflective coating or a discrete reflector) reflects converted light and/or unconverted light passing through the phosphor 240 back into the waveguide 220. The input region 265 is discrete and spatially separate from the output region 215, and converted and unconverted light mix within the input region 265 to form mixed light (e.g., white light) that is preferably substantially uniform in intensity and/or color upon entry into the output region 215. As shown in FIG. 2C, the LED 225 may be positioned at, e.g., the bottom surface of the waveguide 220, and the phosphor 240 may be positioned at the top surface of the waveguide 220. In other embodiments the LED 225 is positioned at a side facet of the waveguide 220 (as in FIG. 2A), which may be slanted or otherwise non-perpendicular to the top surface of the waveguide 220. In addition, the phosphor 240 may be, in general, disposed at any one or more facets within the input region 265.

Figure 3:
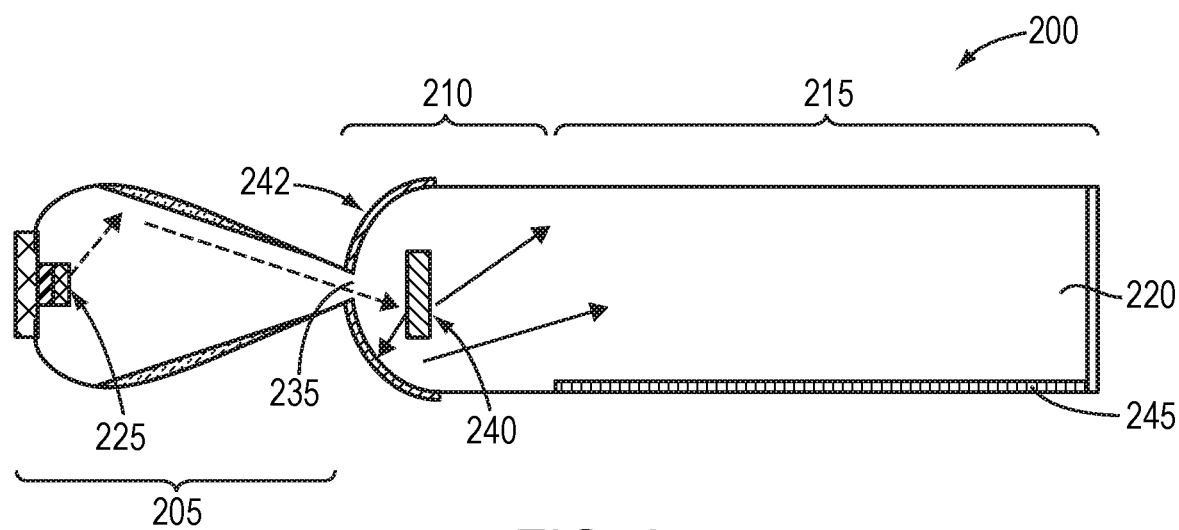
FIGS. 3 and 4 are cross-sectional schematics of illumination devices in accordance with various embodiments of the invention.
Figure 4:
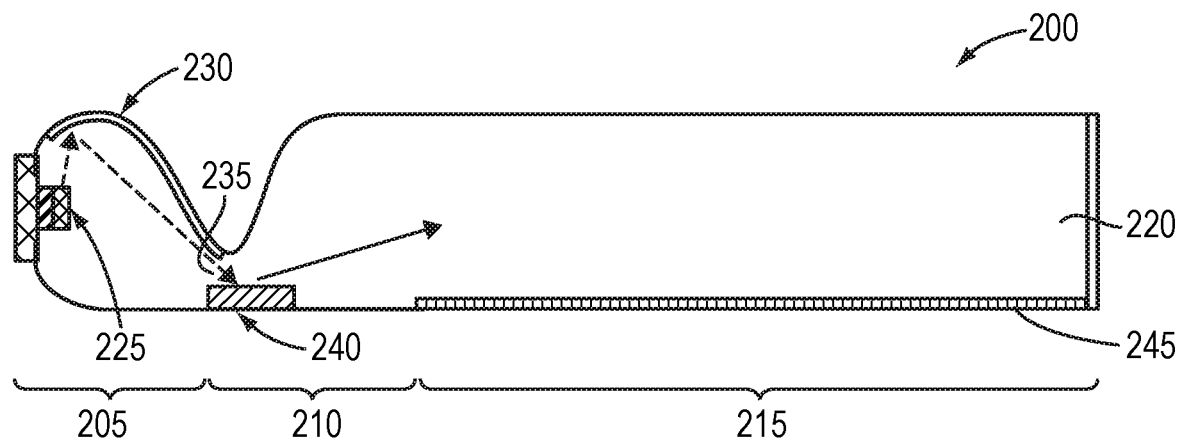

FIGS. 3 and 4 depict illumination apparatuses 200 in accordance with embodiments of the present invention. As shown by the dashed lines, light is emitted from the LED 225, some of which is reflected by TIR (FIG. 3) and/or reflector 230 (which may include or consist essentially of, e.g., a reflective coating, as shown in FIG. 4) through the aperture 235. In the embodiments illustrated in FIGS. 3 and 4, the apertures 235 are defined by the geometry of the waveguide 220 itself, i.e., the waveguide is shaped to form the aperture 235 having a substantially smaller cross-sectional area that that of waveguide 220 away from aperture 235 (e.g., in the output region 215). In FIG. 3, light from the input region 205 strikes the phosphor 240, and at least a portion of the light is wavelength-converted. Portions of the light striking the phosphor 240 may reflect from (before or after conversion) and/or be transmitted through (with or without conversion) the phosphor 240. The light is generally dispersed along multiple directions (even substantially omnidirectionally) and guided toward the output region 215 via TIR at the surfaces of waveguide 220 and/or reflector 242.

In FIG. 4, the phosphor 240 is disposed on the surface of the waveguide 220, and thus light striking the phosphor 240 may only be reflected within the hemisphere of directions within the waveguide 220 (rather than, e.g., diffused omnidirectionally). In FIG. 4, the input region 205 is designed such that light emitted from the LED 225 is directed toward aperture 235 after a minimum number of reflections within the input region 205. In preferred embodiments, light is confined within the input region 205 and/or the conversion region 210 by TIR; however, in some embodiments the input region 205 may include one or more reflectors 230 for light confinement. In FIG. 3, the portion of the conversion region 210 proximate the aperture 235 (i.e., toward input region 205) features a reflector having a curvature shaped to reflect light into a TIR condition. In FIG. 4, the conversion region 210 lacks reflectors, and instead the waveguide itself has curved surfaces shaped to reflect light toward the output region 215. (That is, in FIG. 4, the phosphor 240 is placed within conversion region 210 such that substantially all light is confined in the waveguide by TIR.) The skilled practitioner will recognize that the configurations detailed above are exemplary, and the scope of the invention encompasses other combinations and geometries of of LEDs, phosphors, reflectors, and/or waveguide facets.

Figure 5:
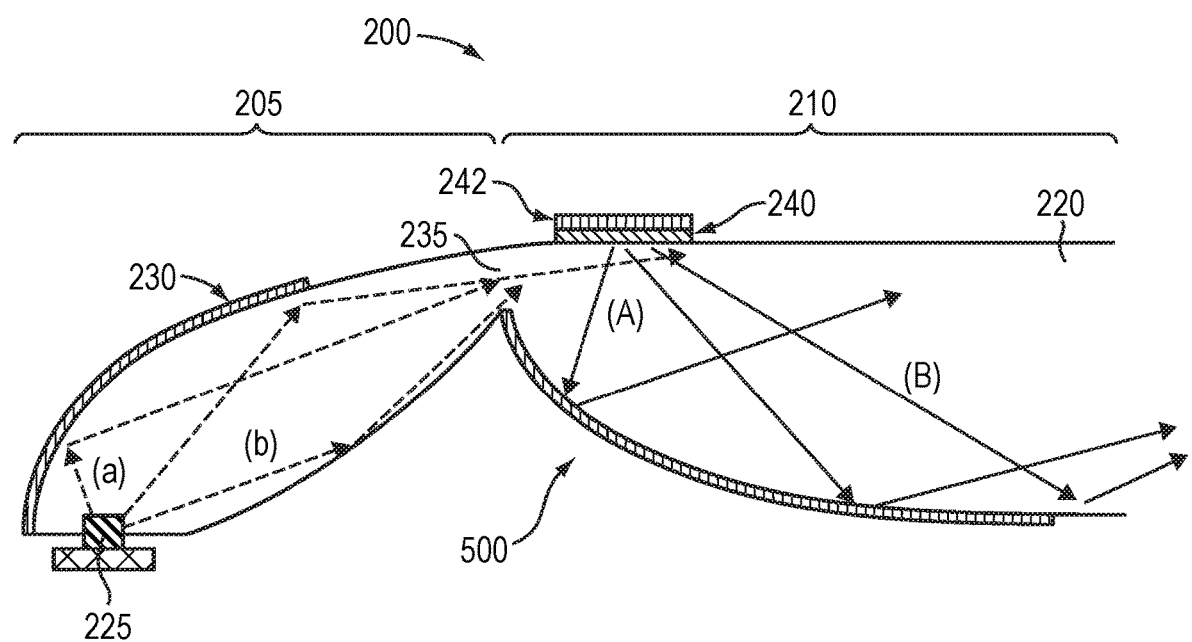
FIGS. 5-7 are cross-sectional schematics of input and conversion regions of illumination devices in accordance with various embodiments of the invention.
Figure 6:
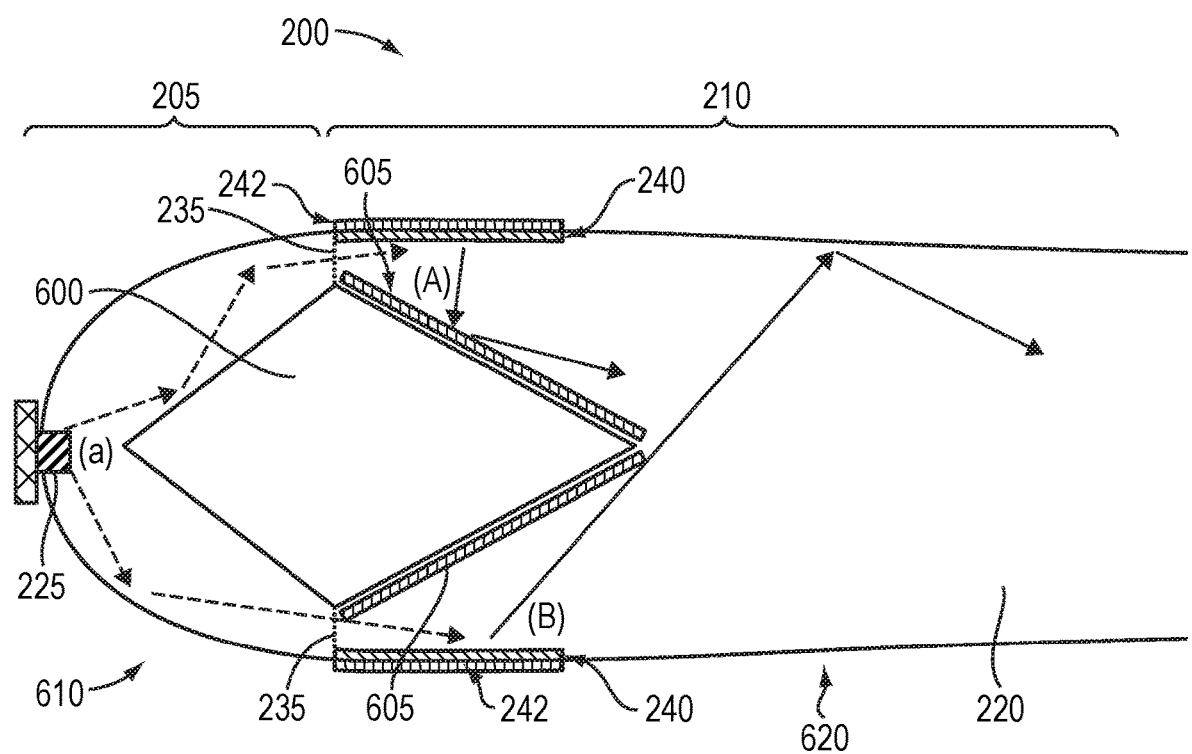
Figure 7:
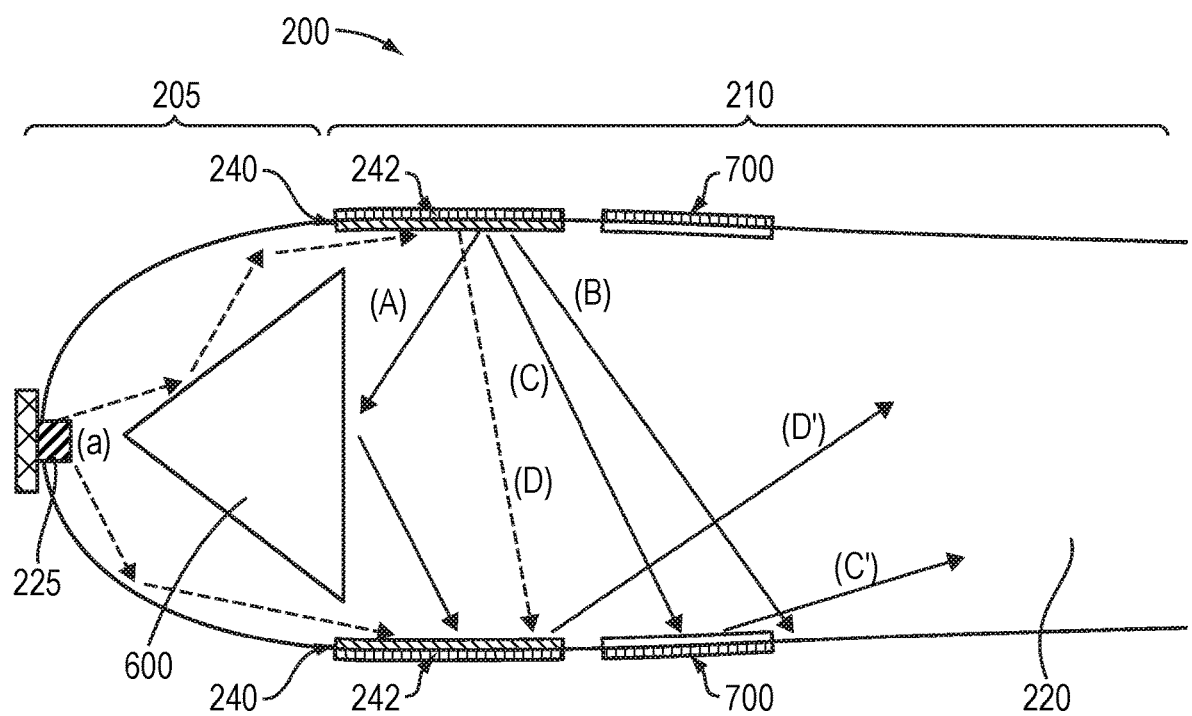

Additional embodiments of the present invention are depicted in FIGS. 5-7, which illustrate only the input region 205 and conversion region 210 of the illumination devices 200 for simplicity. In FIG. 5, light (indicated by the dashed lines) is emitted by the LED 225 and directed toward the aperture 235. The light rays labeled (a) are reflected toward aperture 235 by reflector 230, and the light rays labeled (b) reflect from and are confined within the waveguide 220 by TIR. Various embodiments of the invention confine at least some light within the waveguide 220 by TIR and thus obviate the need for reflectors 230 on at least some portions of the surface of the waveguide 220, thereby advantageously decreasing costs related to the reflector material; in addition, many reflectors 230 are not 100% reflective, and thus light may be more efficiently reflected and confined by TIR than by reflectors. Some of the light is wavelength-converted by the phosphor 240, and the solid arrows represent converted and/or mixed light that (A) is reflected by a reflector 500 in the conversion region 210 and then propagates in a TIR condition to the output region or (B) is already in a TIR condition after propagating away from the phosphor 240. As shown in FIG. 5, preferred embodiments of the invention feature a reflector 242 (which may be a portion of reflector 230 extending from the input region 205) disposed on the phosphor 240 to reflect converted and unconverted light. The reflector 242 may be thermally connected to a heat sink in order to cool the phosphor 240, which may be heated by the flux of light from the input region 205; cooling the phosphor 240 may improve its performance and/or efficiency, which may degrade at elevated temperatures.

FIG. 6 depicts an illumination device 200 in which the aperture 235 is not defined by the external geometry of the waveguide 220; rather, the aperture 235 is defined by an optical cavity (or "polyhedron") 600 disposed within the waveguide. The polyhedron 600 may include or consist of a material different from the material of the waveguide 220 (and/or may have an index of refraction different from that of the waveguide 220) or may be empty or filled with air or one or more other gases or liquids. (As utilized herein, a "polyhedron" or "optical cavity" refers to any solid object, or enclosed space defined by surrounding solid material, and may be substantially spherical or may have multiple planar and/or curved faces.) As shown, at least a portion of the polyhedron 600 may be coated by one or more reflectors 605. In FIG. 6, the light from LED 225 is side-coupled (i.e., input from the side facet of the waveguide), although this and other embodiments of the invention may feature either side or bottom coupling of the LED 225. As also shown in FIG. 6, the aperture is annular, and thus light propagates to the conversion region 210 around multiple sides of the polyhedron 600. In other embodiments of the invention, the polyhedron 600 is attached to or is an integral portion of a surface of the waveguide. In some embodiments, at least a portion of the polyhedron 600 is outside of the waveguide 220, which is consequently shaped in a fashion similar to that shown in FIG. 5.

The waveguide 220 and polyhedron 600 may be fabricated by any of a variety of techniques. For example, the waveguide 220 may be molded in at least two discrete pieces that are attached together to define the waveguide 220; any or all of the pieces may also define the polyhedron 600—FIG. 6 depicts two pieces 610, 620 that fit together to define the waveguide 220 and the polyhedron 600. As shown in FIG. 6, the piece 610 may include the input region 205, and the piece 620 may include the conversion region 210 and output region 215 (not shown). Prior to assembly of the pieces 610, 620, all or a portion of the inside surface of the polyhedron 600 may be coated with a reflector 230, as shown in FIG. 6, or the polyhedron 600 may be partially or substantially completely filled with another material.

In FIG. 6, light rays (a) are emitted from the LED 225 and directed toward the aperture 235 and phosphor 240 via reflections from the waveguide facets and the surface of the polyhedron 600 facing the input region 205. Other embodiments of the invention may incorporate different facet and surface curvatures and/or utilization of additional reflectors. In the conversion region 210, converted or mixed light may (A) reflect from a surface of the polyhedron 600 (and/or a reflector 605 thereon) and propagate toward the output region in a TIR condition or (B) be already confined in a TIR condition after propagating away from the phosphor 240. Preferably converted and mixed light in the conversion region 210 not striking a surface of the polyhedron 600 is already confined inside waveguide 220 in a TIR condition.

FIG. 7 depicts an illumination device 200 in which, in the conversion region 210, the polyhedron 600 is shaped to enable light to propagate across the waveguide 220 from one portion of phosphor 240 to another (the phosphor 240 may be disposed on the waveguide surface in two or more discrete regions or may wrap around the waveguide in a single continuous region). In such embodiments, phosphor utilization is enhanced, as light not converted by one portion of the phosphor 240 may strike another portion of the phosphor 240 and be converted. For example, a light ray (D) not converted by the top phosphor region 240 propagates to the bottom phosphor region 240 and is wavelength-converted, forming light ray (D'). Also shown in FIG. 7 are light ray (A) that strikes the polyhedron 600 in a TIR condition and propagates to the bottom phosphor region 240, as well as light ray (B) that reflects away from the phosphor 240 already in a TIR condition (i.e., confined by TIR). Light ray (C) represents light reflected from the phosphor 240 not in a TIR condition but that does not strike another portion of phosphor 240. In order to decrease the amount of light falling into this category, the illumination device 200 may incorporate one or more diffusive reflectors 700 along portions of the surface of waveguide 220 between phosphor 240 and points on the surface of waveguide 220 sufficiently distant from the phosphor 240 such that light striking them is confined by TIR. At least a portion of the light reflecting from the diffusive reflector 700 reflects into a TIR condition, as represented by light ray (C'). In some embodiments, for convenience, reflectors 700 and 242 may be portions of a single reflector.

Figure 8:
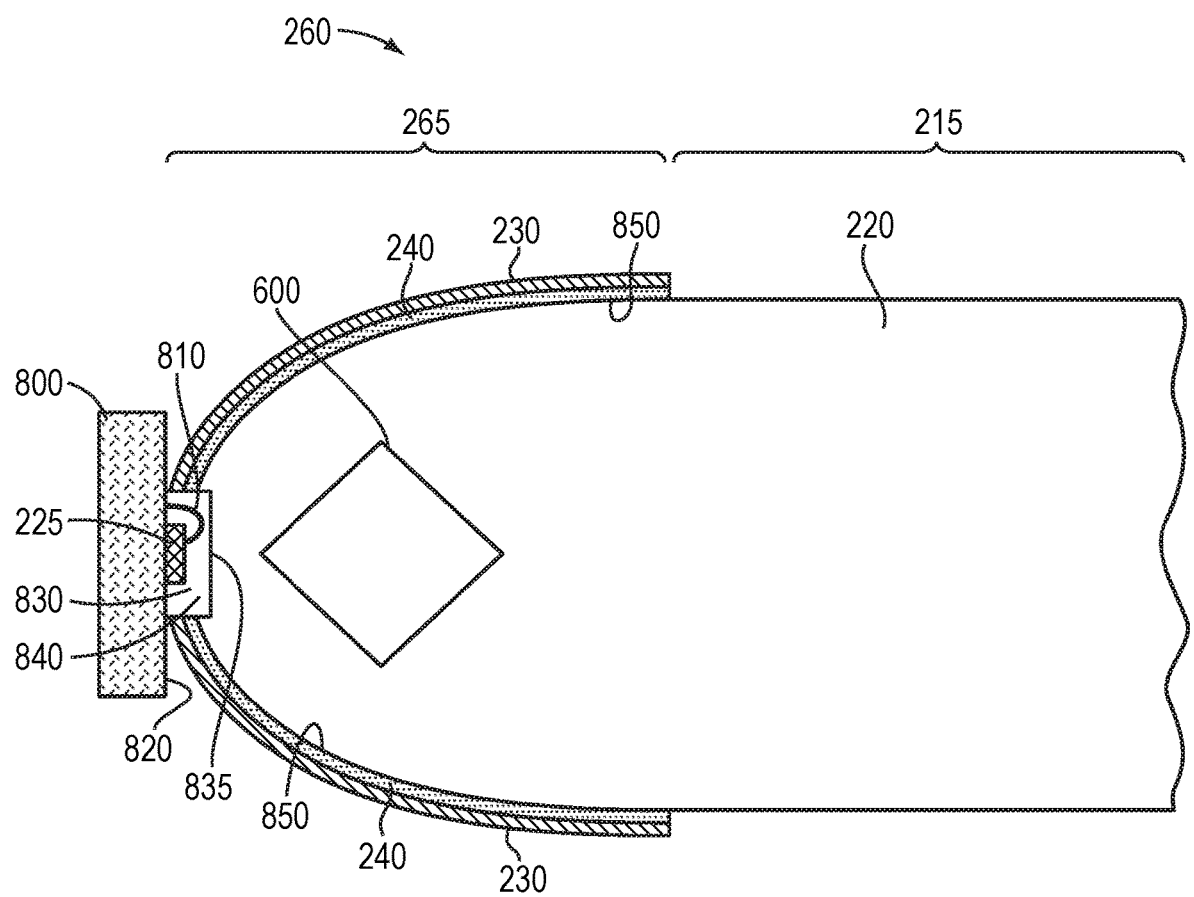
FIGS. 8, 9, and 10A are cross-sectional schematics of input and partial output regions of illumination devices in accordance with various embodiments of the invention.

FIG. 8 depicts an illumination device 260, in accordance with various embodiments of the invention, which features an input region 265 containing phosphor 240. In FIG. 8, the phosphor 240 covers most, or even substantially all, of the surface of the waveguide 220 in the input region 265, and light from input region 265 propagates directly to the output region 215. In other embodiments of the invention, the phosphor 240 is disposed on the surface of the waveguide 220 in only a portion of the input region 265. As shown, the LED 225 is mounted on a substrate 800 and electrically connected thereto by, e.g., one or more wires 810. The substrate 800 may dissipate at least a portion of heat generated by the LED 225 during operation and may include or consist essentially of any suitable rigid material, e.g., a metal-core printed circuit board. Substrate 800 is preferably coated with a reflective coating 820 (or the top surface 820 is itself reflective) such that any light striking substrate 800 propagates into the waveguide 220. As shown, the LED 225 may be disposed within a recess 830 defined by the waveguide 220. The recess 830 defines an interface 835 with the waveguide 220, and the recess 830 may be partially or substantially completely filled with an encapsulating material 840 that preferably has an index of refraction substantially the same as that of the waveguide 220. In other embodiments the LED 225 is disposed outside of the recess 830 or the waveguide 220 may not define a recess 830. In the input region 265, a surface 850 of the waveguide 220 may be shaped to minimize optical loss therein; for example, the surface 850 may be substantially parabolic as shown in FIG. 8.

The phosphor 240 is disposed on the surface 850, for example by incorporating it in an adhesive paint or via a transparent adhesive or other attachment mechanism, thereby reducing or substantially eliminating Fresnel reflections between the waveguide 220 and the phosphor 240. Preferably the phosphor 240 is in optical contact with the waveguide 220; thus, there is no air gap between the phosphor 240 and the waveguide 220, and light confined by TIR propagates to the phosphor 240. A reflector 230 is disposed over the phosphor 240, and may be attached to the phosphor 240 via a transparent adhesive or encapsulant. In some embodiments the reflector 230 is in optical contact with phosphor 240, and thus there is no air gap therebetween. In other embodiments the reflector 230 is in mechanical but not optical contact with the phosphor 240, and there is thus an air gap therebetween. The reflector 230 may be specular (e.g., a mirror) or diffusive, and may be deposited over phosphor 240 by, e.g., electroplating, electroless plating, evaporation, sputtering, or chemical vapor deposition. The reflector 230 may include or consist essentially of a thin reflective sheet or layer that is applied by e.g., bonding, lamination, or via an adhesive.

Figure 9:
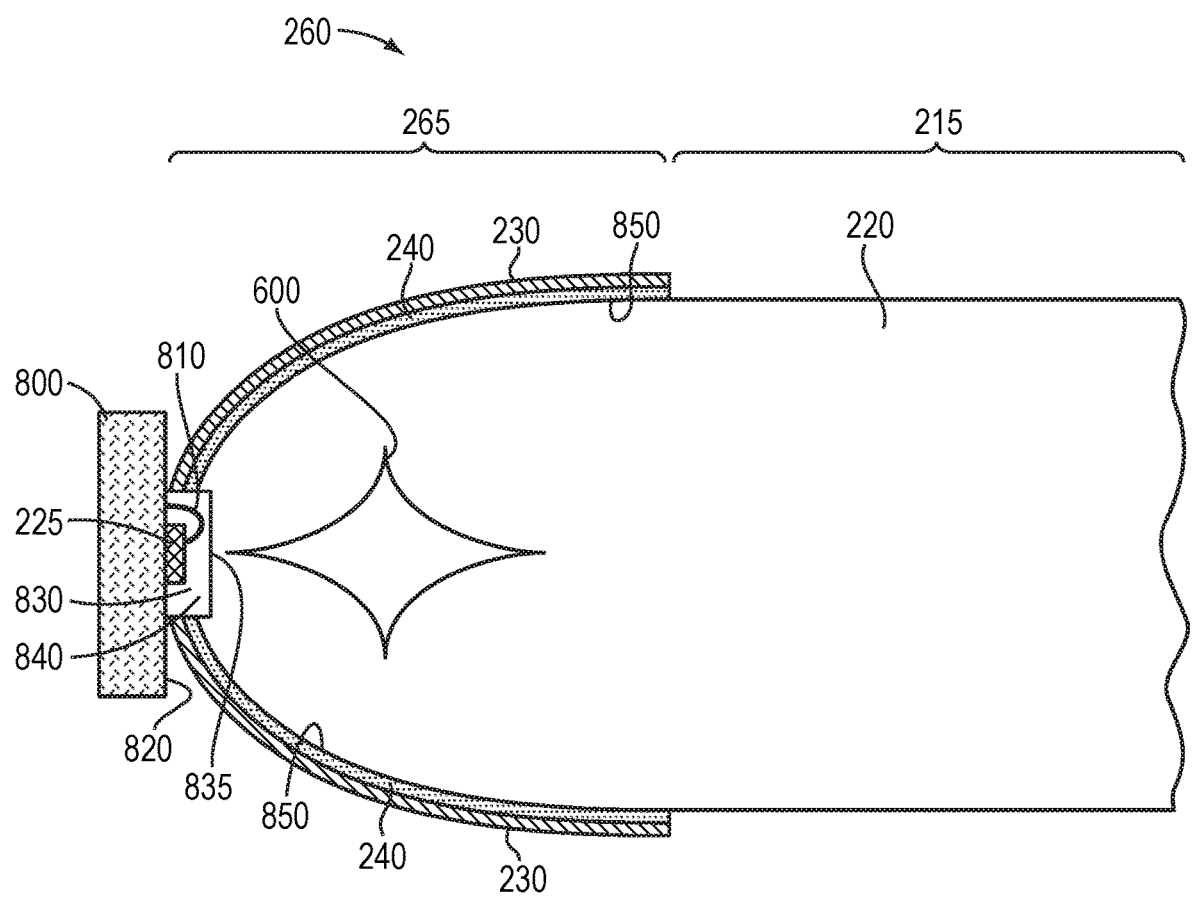

In FIG. 8 the illumination device 260 also features an optical cavity 600 within the waveguide 220 in the input region 265. As shown, the optical cavity is empty (e.g., filled with air) and thus surrounded by the material of waveguide 220 that has a larger refractive index. Thus, light propagating within waveguide 220 and striking the optical cavity 600 will be refracted or totally reflected, depending on the angle of incidence. The optical cavity 600 may have substantially planar surfaces, as shown in FIG. 8, and/or curved surfaces, as shown in FIG. 9.

Figure 10A:
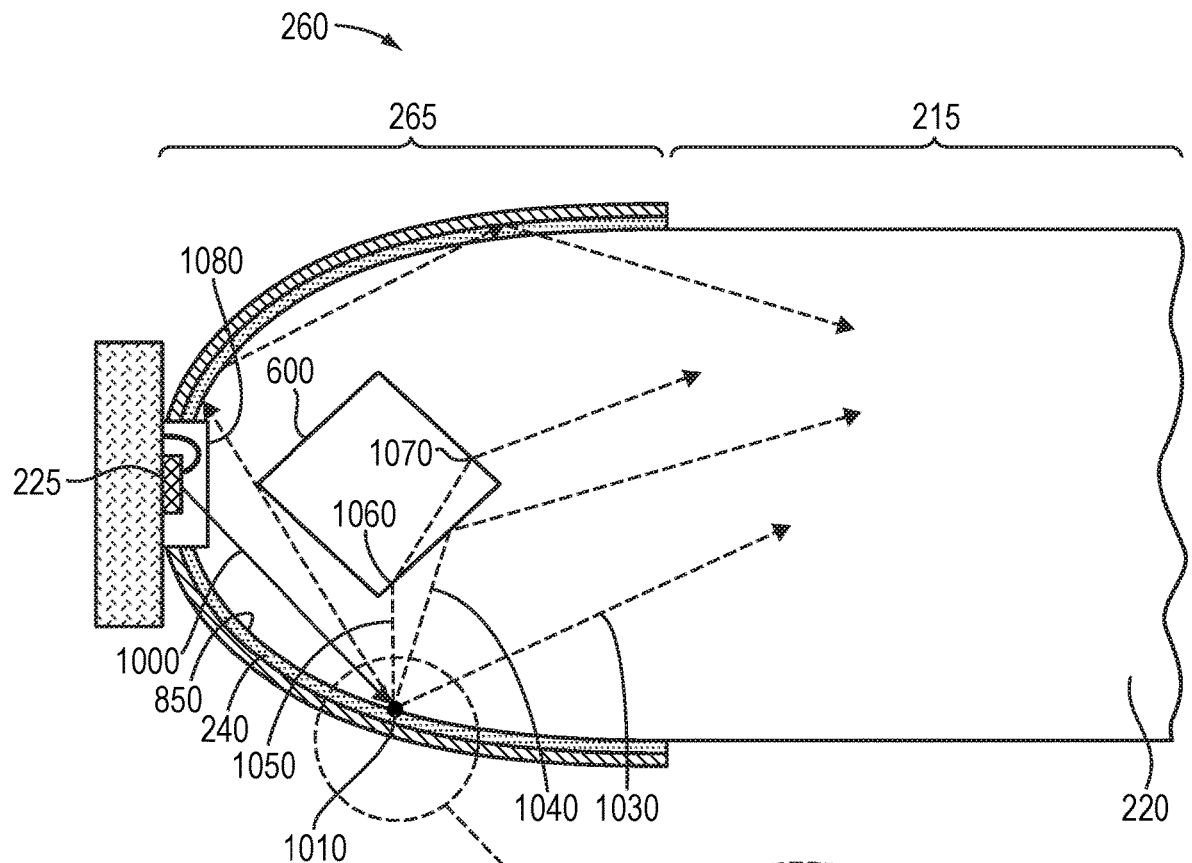
Figure 10B:
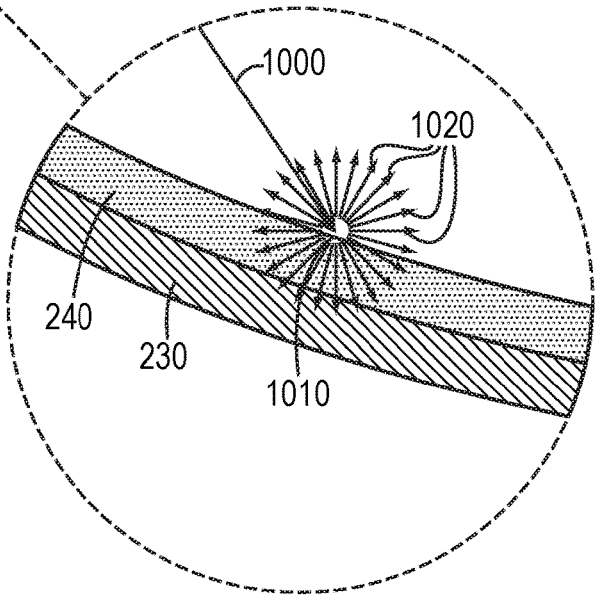
FIG. 10B is an enlarged portion of FIG. 10A.

FIGS. 10A and 10B illustrate various light-ray trajectories for light emitted by the LED 225 in accordance with various embodiments of the present invention. Light ray 1000 is emitted by the LED 225 such that it propagates directly to the phosphor 240 at a location 1010. Once it strikes the phosphor 240, the light ray enters phosphor 240 and strikes photoluminescent particles therein, exciting the particles and generating secondary light that is emitted in all directions 1020. As shown in FIG. 10B, approximately half of the secondary radiation is emitted back into the waveguide 220. For example, a light ray 1030 propagates toward the output region 215, and a light ray 1040 strikes the optical cavity 600 at an angle of total reflection and is redirected toward output region 215. A light ray 1050 strikes the optical cavity 600 at a location 1060 at an angle such that it is not totally reflected by the surface of the optical cavity 600, enters the optical cavity 600 at location 1060, exits the optical cavity at a location 1070, and propagates toward the output region 215. A light ray 1080 strikes the reflector 230 and is reflected back toward the output region 215. As understood by those of skill in the art, there are many possible paths for light emission, refraction, and reflection within waveguide 220, and those described above are merely exemplary.

As shown in FIG. 10B, approximately half of the secondary radiation is emitted from the phosphor 240 in the direction away from the waveguide 220. As these light rays propagate in the phosphor 240 (i.e., a scattering medium), some of the rays will change direction and propagate toward output region 215. Others of these light rays will reach the reflector 230 and will be reflected back toward phosphor 240 and the waveguide 220. Light emitted by the LED 225 that traverses the phosphor 240 without being wavelength-converted (e.g., by not being absorbed by photoluminescent particles) will generally reach the reflector 230 and be redirected toward the phosphor 240; this effective doubling of the light-ray trajectory within the phosphor 240 increases the probability of wavelength-conversion, thus enabling thinner phosphors 240 to be utilized in accordance with embodiments of the present invention. Thus, in general, secondary light emitted by the phosphor 240 away from the waveguide 220 will be scattered toward the waveguide 220 or reflected toward the waveguide 220 by the reflector 230. However, in some embodiments of the invention, some light may not propagate to the output region 215, as it may be absorbed by the waveguide, the phosphor 240, the reflector 230, and/or the LED 225 itself. Thus, preferred embodiments of the invention reduce total optical loss by utilizing a low-loss waveguide and reflectors that have high reflectivity (i.e., as close to 100% reflectivity as possible), and/or by utilizing as few LEDs 225 as possible (and/or LEDs 225 with small sizes), and/or by utilizing discrete conversion regions as detailed above.

Figure 11:
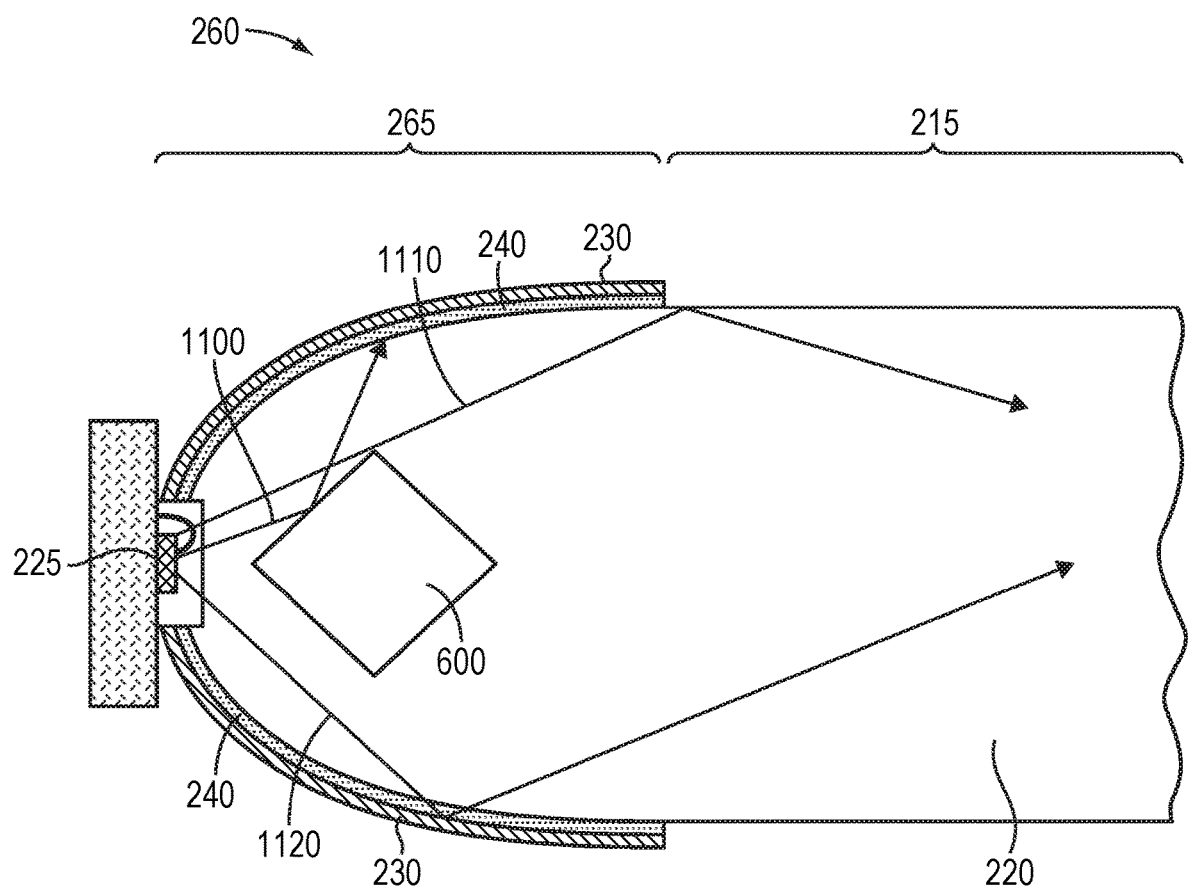
FIG. 11 is a cross-sectional schematic of an input and a partial output region of an illumination device in accordance with various embodiments of the invention.

FIG. 11 depicts an embodiment of the present invention in which a light ray 1100 is emitted by the LED 225, strikes the optical cavity 600 at an angle of total internal reflection, and is reflected toward the phosphor 240. A light ray 1110 is emitted by the LED 225 and propagates toward the output region 215 without striking the phosphor 240 or the optical cavity 600. The light ray 1110, not being wavelength-converted, may be emitted from the waveguide 220 as part of the mixed light as it mixes with converted light in the input region 265. Similarly, a light ray 1120 traverses the phosphor 240 without being wavelength-converted, is reflected by the reflector 230, remains unconverted as it traverses phosphor 240 again, and propagates toward output region 215. Such light may be emitted from the waveguide 220 as part of the mixed light as it mixes with converted light in the input region 265.

Figure 12:
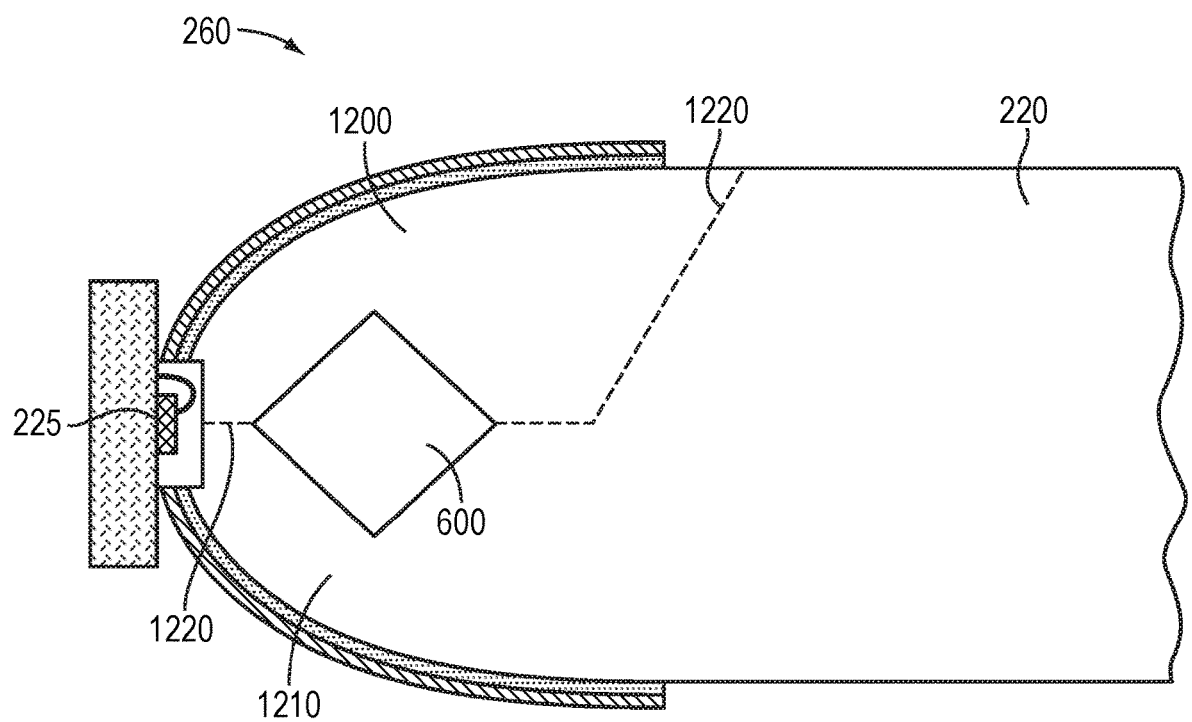
FIG. 12 is a cross-sectional schematic of an illumination device fabricated from multiple parts in accordance with various embodiments of the invention.

In various embodiments of the present invention, the optical cavity 600 extends along substantially the entire width (i.e., the direction into the page in the figures) of the waveguide 220 and/or the waveguide and associated optical cavity are difficult to fabricate by conventional molding techniques. FIG. 12 depicts one method of fabricating a waveguide 220 with an optical cavity 600 therein. As shown, the waveguide 220 is fabricated by joining two portions 1200, 1210 at an interface 1220. Portion 1210 includes the majority of the waveguide 220 and defines the bottom portion of the optical cavity 600, which the portion 1200 mates with portion 1210 and defines the top portion of the optical cavity 600. Once joined (e.g., via a transparent optical adhesive), the two portions 1200, 1210 collectively constitute the illumination device 260.

Figure 13:
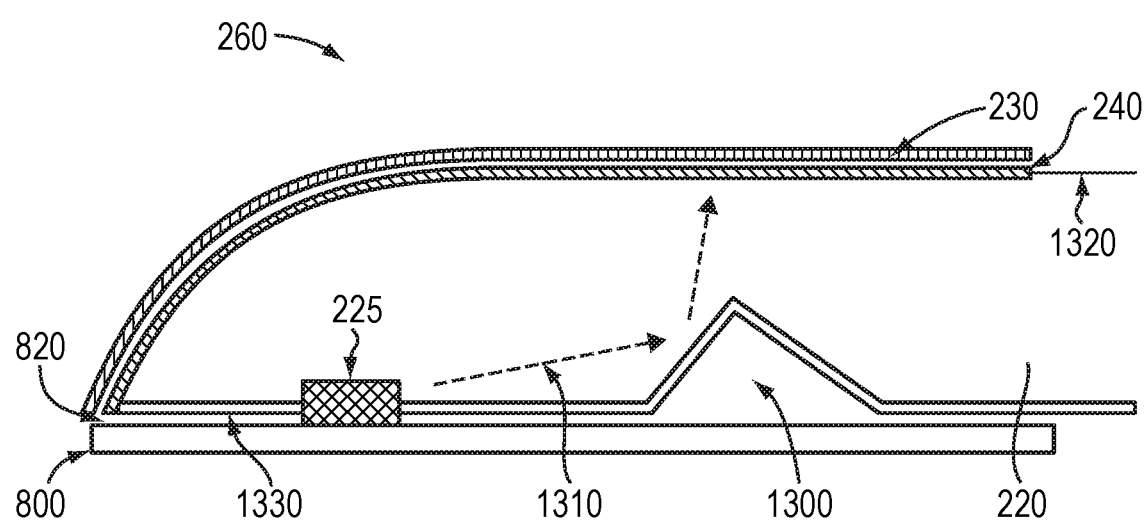
FIGS. 13 and 14 are cross-sectional schematics of input regions of illumination devices in accordance with various embodiments of the invention.

FIG. 13 depicts an illumination device 260 in accordance with various embodiments of the present invention, in which the optical cavity 600 is replaced by a protrusion 1300 that may itself be reflective (or may be utilized in combination with a reflector or reflective surface beneath it). In the illustrated embodiment, the protrusion 1300 is a protruding portion of the bottom waveguide surface, and the LED 225 is also located at the bottom surface of waveguide 220. As shown, a light ray 1310 emitted by the LED 225 that strikes the protrusion 1300 is directed toward a surface 1320 of the waveguide 220 along which the phosphor 240 and reflector 230 are located. The protrusion 1300 may reflect light via TIR or may be coated with a reflective coating.

In the configuration of FIG. 13, many light rays tend to strike a bottom facet 1330 of the waveguide 220, and thus it is preferable that facet 1330 is reflective and/or that the surface 820 of the LED substrate 800 is reflective (e.g., coated with a reflective coating). In FIG. 13 an air gap is shown between the waveguide 220 and the LED substrate 800. This air gap is optional, although in preferred embodiments the air gap reduces or minimizes optical loss from the waveguide 220. Within the waveguide 220, many light rays are already propagating within TIR conditions, and realistic reflectors have reflectivities less than 100%. Thus, preferred embodiments of the present invention do not alter the propagation condition of the light rays already propagating in TIR conditions by disposing the air gap between the waveguide 220 and the LED substrate 800 and by coating the surface 820 of the LED substrate 800 with a reflective coating rather than coating the bottom surface of the waveguide 200.

In FIG. 13 the surface 1320 is illustrated as having a curved profile; however, this need not be the case, and other planar or non-curved configurations are possible. While the protrusion 1300 is not required in many embodiments of the present invention, the protrusion 1300 does prevent some unconverted light from LED 225 from propagating directly to the output region 215 and thus facilitates light mixing and the attainment of substantial uniformity of color and/or intensity within an input region 265 having a small lateral extent. (Thus, in some embodiments of the invention, the need for protrusion 1300 is obviated by utilizing a longer phosphor layer 240 and input region 265.)

Figure 14:
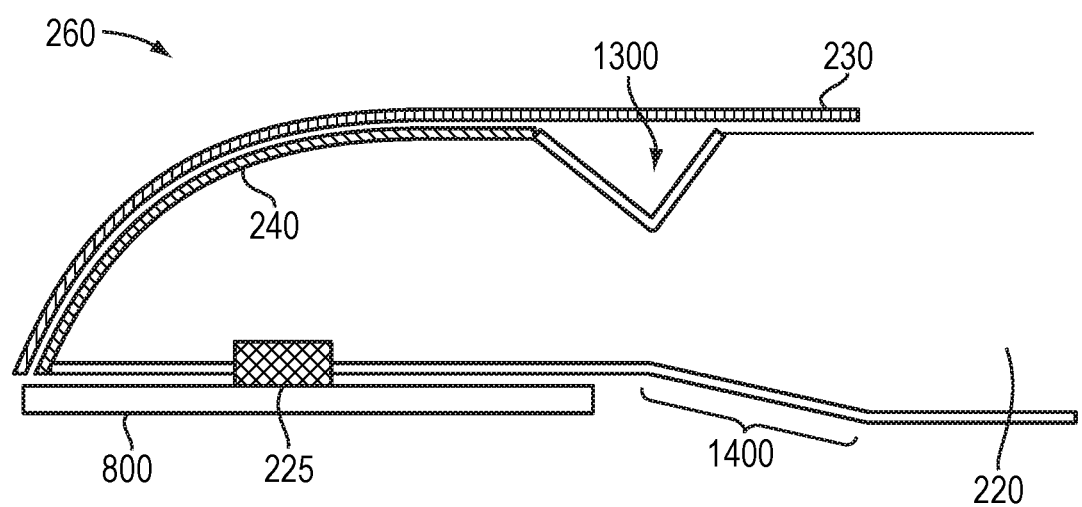

FIG. 14 depicts another illumination device 260 in accordance with embodiments of the present invention. Rather than a protrusion at the bottom surface of the waveguide, the illustrated embodiment features a protrusion 1300 on the top facet of waveguide 220 opposite the LED 225. Such a protrusion 1300 serves to enhance mixing of converted and unconverted light within the input region 265. This illustrated embodiment also incorporates a wedge 1400 near the interface between the input region 265 and the output region 215 to promote uniformity of the light within the output region 215.

Figure 15A:
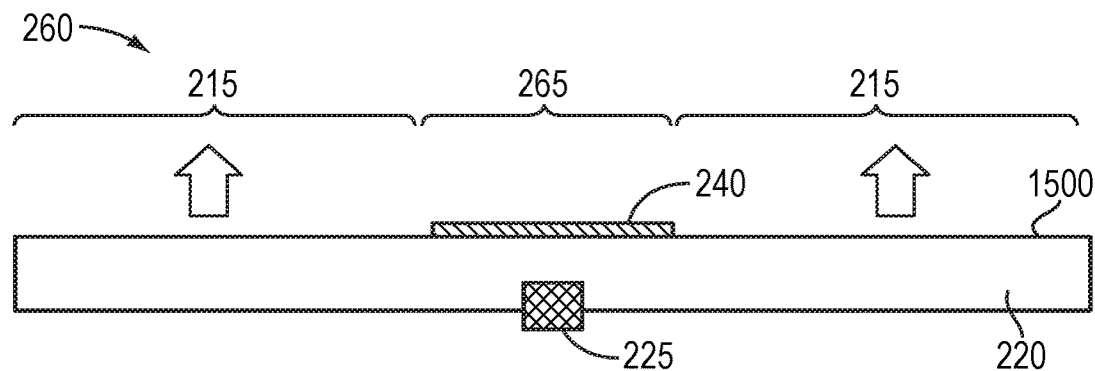
FIGS. 15A and 15B are cross-sectional schematics of illumination devices in accordance with various embodiments of the invention.
Figure 15B:
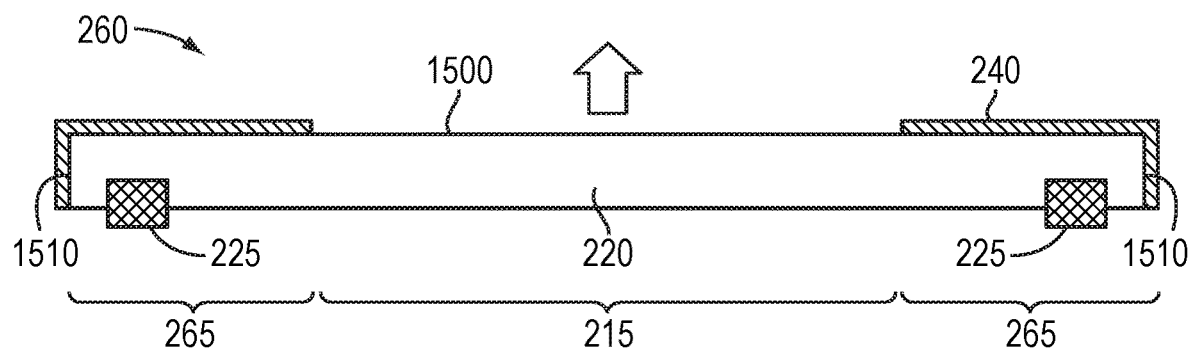

Configurations of embodiments of the invention without protrusions or curved waveguide surfaces are depicted in FIGS. 15A and 15B. In FIG. 15A, the illumination device 260 features a single input region 265 and multiple output regions 215, and in FIG. 15B, the illumination device 260 features multiple input regions 265 and a single output region 215. Reflectors and other various elements are not depicted in FIGS. 15A and 15B for simplicity; however, in various embodiments, reflectors are disposed over the phosphors 240 and may even extend over the entirety of the input region(s) 265 or only a portion thereof, and over the bottom, top, and/or side facets. For example, in FIG. 15A the phosphor 240 is located only over the top surface 1500 of the waveguide 220, while in FIG. 15B the phosphor 240 is located over top surface 1500 and side surfaces 1510 of the waveguide 220. Embodiments of the invention also include illumination devices having multiple input and conversion regions propagating light to a single output region, as well as illumination devices having a single input region, a single conversion region, and multiple output regions receiving light from the input and conversion regions.

Figure 16:
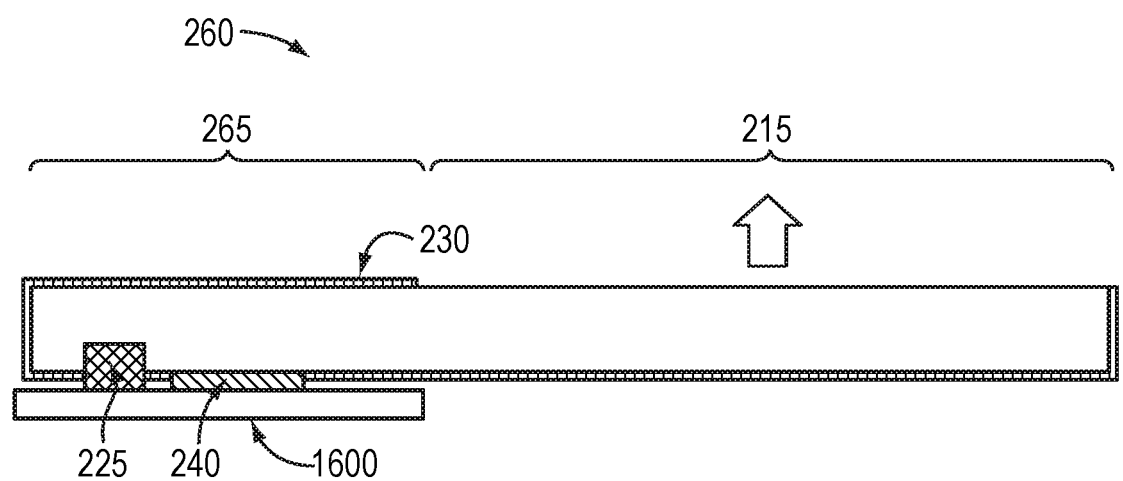
FIG. 16 is a cross-sectional schematic of an illumination device in accordance with various embodiments of the invention.

FIG. 16 depicts an embodiment of the present invention in which the LED 225 and phosphor 240 are both thermally connected to a heat sink 1600. Embodiments of the invention feature small-area phosphors 240, and thus the optical density of light striking the phosphor 240 tends to be high. As the light is wavelength-converted, heat is released due to the energy difference between the absorbed (typically higher-frequency) light and the emitted converted (typically lower-frequency) light, i.e., due to the Stoke's shift. Such heat may degrade the efficiency of the phosphor 240 in the absence of heat dissipation through the heat sink 1600, which may include or consist essentially of one or more metals or other materials with high thermal conductivity, and may feature protruding features such as fins and/or even active cooling mechanisms such as fans. The configuration illustrated in FIG. 4 may also feature a heat sink thermally connected to the phosphor 240, and the heat sink may also be thermally connected to the LED 225.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. An illumination apparatus comprising:
    a waveguide having (i) top and bottom opposed surfaces, (ii) a side surface spanning the top and bottom surfaces, (iii) an input region for receiving light, and (iv) spatially separated from the input region, a substantially planar output region for emitting light, the output region having an output surface comprising at least a portion of the top surface of the waveguide;
    at least partially embedded within the bottom surface of the waveguide in the input region proximate the side surface, a light source for emitting light into the input region;
    disposed on at least one surface of the waveguide in the input region, a layer of phosphor material for converting a first portion of light emitted from the light source to converted light having a different wavelength, wherein the layer of phosphor material is positioned such that a second portion of light emitted from the light source does not encounter the layer of phosphor material and propagates to the output surface as unconverted light; and
    an out-coupling structure, disposed in the output region, for causing light to be emitted from the output surface, the emitted light comprising a mixture of converted light and unconverted light.

2. The apparatus of claim 1, wherein the output surface comprises only a portion of the top surface of the waveguide.

3. The apparatus of claim 1, wherein the side surface of the waveguide is perpendicular to the top surface of the waveguide.

4. The apparatus of claim 1, wherein the waveguide comprises silicone.

5. The apparatus of claim 1, wherein the out-coupling structure is disposed at the bottom surface of the waveguide.

6. The apparatus of claim 1, wherein no phosphor material is disposed within the output region or on the output surface.

7. The apparatus of claim 1, wherein the layer of phosphor material is disposed on a portion of the top surface of the waveguide within the input region.

8. The apparatus of claim 7, wherein the layer of phosphor material is also disposed on the side surface of the waveguide within the input region.

9. The apparatus of claim 1, wherein the layer of phosphor material is disposed on the side surface of the waveguide within the input region.

10. The apparatus of claim 1, further comprising one or more reflectors (i) disposed over a portion of the top surface of the waveguide and/or (ii) disposed over the side surface of the waveguide.

11. The apparatus of claim 1, wherein the light source is disposed on a substrate, a top surface of the substrate (i) facing the waveguide and (ii) being reflective.

12. The apparatus of claim 1, wherein the light source comprises a light-emitting diode.

13. An illumination apparatus comprising:
    a waveguide having (i) top and bottom opposed surfaces, (ii) a side surface spanning the top and bottom surfaces, (iii) an input region for receiving light, and (iv) spatially separated from the input region, a substantially planar output region for emitting light, the output region having an output surface comprising at least a portion of the top surface of the waveguide;
    at least partially embedded within the bottom surface of the waveguide in the input region proximate the side surface, a light source for emitting light into the input region;
    disposed on at least one surface of the waveguide in the input region, a layer of phosphor material for converting a first portion of light emitted from the light source to converted light having a different wavelength, wherein the layer of phosphor material is positioned such that a second portion of light emitted from the light source does not encounter the layer of phosphor material and propagates to the output surface as unconverted light;
    an out-coupling structure, disposed in the output region, for causing light to be emitted from the output surface, the emitted light comprising a mixture of converted light and unconverted light; and
    one or more reflectors (i) disposed over a portion of the top surface of the waveguide and/or (ii) disposed over the side surface of the waveguide, wherein each reflector is disposed over at least a portion of the layer of phosphor material.

14. The apparatus of claim 13, wherein the light source is at least partially embedded within the bottom surface of the waveguide.

15. The apparatus of claim 13, wherein the light source is at least partially embedded within the side surface of the waveguide.

16. The apparatus of claim 13, wherein the layer of phosphor material is disposed, within the input region, on the top surface of the waveguide and/or on the side surface of the waveguide.

17. An illumination apparatus comprising:
a waveguide having (i) top and bottom opposed surfaces, (ii) a first side surface spanning the top and bottom surfaces, (iii) a second side surface, opposite the first side surface, spanning the top and bottom surfaces, (iv) a first input region for receiving light, (v) a second input region for receiving light, and (vi) spatially separated from the first and second input regions, a substantially planar output region for emitting light, the output region having an output surface comprising at least a portion of the top surface of the waveguide;
at least partially embedded within the waveguide in the first input region proximate the first side surface, a first light source for emitting light into the first input region;
at least partially embedded within the waveguide in the second input region proximate the second side surface, a second light source for emitting light into the second input region;
disposed on at least one surface of the waveguide in the first input region, a first layer of phosphor material for converting a first portion of light emitted from the first light source to first converted light having a different wavelength, wherein the first layer of phosphor material is positioned such that a second portion of light emitted from the first light source does not encounter the first layer of phosphor material and propagates to the output surface as first unconverted light;
disposed on at least one surface of the waveguide in the second input region, a second layer of phosphor material for converting a third portion of light emitted from the second light source to second converted light having a different wavelength, wherein the second layer of phosphor material is positioned such that a fourth portion of light emitted from the second light source does not encounter the second layer of phosphor material and propagates to the output surface as second unconverted light; and
an out-coupling structure, disposed in the output region, for causing light to be emitted from the output surface, the emitted light comprising a mixture of first converted light, second converted light, first unconverted light, and second unconverted light.

18. The apparatus of claim 17, wherein the output surface comprises only a portion of the top surface of the waveguide.

19. The apparatus of claim 17, wherein:
the first side surface of the waveguide is perpendicular to the top surface of the waveguide; and
the second side surface of the waveguide is perpendicular to the top surface of the waveguide.

20. The apparatus of claim 17, wherein:
the first light source is at least partially embedded within the bottom surface of the waveguide; and
the second light source is at least partially embedded within the bottom surface of the waveguide.

21. The apparatus of claim 17, further comprising one or more reflectors (i) disposed over the first layer of phosphor material and/or (ii) disposed over the second layer of phosphor material.

* * * * *